United States Patent [19]

Iwase et al.

[11] Patent Number: 5,208,780

[45] Date of Patent: May 4, 1993

[54] STRUCTURE OF ELECTRICALLY PROGRAMMABLE READ-ONLY MEMORY CELLS AND REDUNDANCY SIGNATURE THEREFOR

[75] Inventors: Taira Iwase, Kawasaki; Makoto Takizawa, Yokohama; Shigefumi Ishiguro, Chigasaki; Kazuhiko Nobori, Kawasaki, all of Japan

[73] Assignee: Kabushiki Kaisha Toshiba, Kawasaki, Japan

[21] Appl. No.: 731,467

[22] Filed: Jul. 17, 1991

[30] Foreign Application Priority Data

Jul. 17, 1990 [JP] Japan ................. 2-188447
Jul. 17, 1990 [JP] Japan ................. 2-188451

[51] Int. Cl.$^5$ ............................. G11C 17/16
[52] U.S. Cl. ......................... 365/225.7; 365/96
[58] Field of Search ................ 365/225–227, 365/96

[56] References Cited

U.S. PATENT DOCUMENTS

| 4,287,569 | 9/1981 | Fukushima | 365/96 |
| 4,970,686 | 11/1990 | Naruke et al. | 365/96 |
| 5,056,061 | 10/1991 | Akylas et al. | 365/225.7 X |
| 5,058,059 | 10/1991 | Matsuo et al. | 365/96 |
| 5,079,746 | 1/1992 | Sato | 365/225.7 |

OTHER PUBLICATIONS

"Naruke et al." Nonvolatile Memories, A 16Mb Mask ROM with programmable Redundancy, IEEE International Solid-State Circuits Conference, 1989.

Primary Examiner—Eugene R. LaRoche
Assistant Examiner—Do Hyum Yoo
Attorney, Agent, or Firm—Foley & Lardner

[57] ABSTRACT

In an electrically programmable ROM, each cell 13 includes a series-connected element composed of a combination writing and reading transistor 17 and a fuse 15. One end of this series-connected element is connected to a corresponding bit line 19, and the other end thereof is grounded. A gate of the transistor 17 of the series-connected element is connected to a corresponding word line 23. Each bit line 19 is connected to a high-voltage applying pad 21 via an element such as diode or transistor provided with electrically connecting/isolating functions. When a data is written in the memory cell 13, the high-voltage applying pad 21 is electrically connected to the bit line 19. Under these conditions, if a high voltage is applied to the high-voltage applying pad 21, the transistor 17 performs snap-back action (i.e. secondary breakdown) to blow out the fuse 15. When the data is read, the high-voltage applying pad 21 is isolated from the bit line 19 without exerting influence upon the read out operation. In addition, in the above-mentioned electrically programmable ROM, a circuit for electrically blowing out the fuse by utilizing transistor's snap-back action is used as a redundancy signature indicative of whether the redundancy circuit is used or unused.

3 Claims, 4 Drawing Sheets

STRUCTURE OF ELECTRICALLY PROGRAMMABLE READ-ONLY MEMORY CELLS AND REDUNDANCY SIGNATURE THEREFOR

BACKGROUND OF THE INVENTION

The present invention relates generally to a semiconductor memory device, and more specifically to a structure of electrically programmable read-only memory cells, which is suitable for use as ROM spare cells provided with redundant structure. Further, the present invention relates to redundancy signature for a ROM of redundant structure.

As electrically programmable read-only memory cells, there have been proposed several types of memory cells as follows: transistors are combined with fuses, respectively; data are programmed by destructing diodes or oxide films, respectively; etc. Above all, memory cells including fuses, writing transistors, and reading transistors have been widely and preferably used as spare cells in the redundancy circuit (for detective cell relief) of a mask ROM, because the manufacturing process is simple, the reliability is high, and the program is easy to prepare. FIG. 1 shows a circuit diagram of the memory cells.

In the prior-art circuit shown in FIG. 1, however, since a single memory cell 1 is composed of three elements of a writing transistor 3, a reading transistor 5, and a fuse 7, the area occupied by a single cell 1 is relatively large. Therefore, when the memory cells are used as spare cells in the redundancy circuit of a mask ROM, there exists a problem in that the chip size increases as the number of spare cells is increased to improve the effect of defective cell relief.

To overcome this problem, it may be considered that a single transistor is used in common as the writing and reading transistors. However, where the transistors are simply arranged as described above, since bit lines 9 are directly connected to a pad 11 to which a high voltage is applied, there arises another problem in that parasitic capacitances of the high-voltage applying pad 11 and other elements (e.g. probe) for applying high voltage to the pad are directly connected to the bit lines 9, with the result that the operating speed is reduced.

SUMMARY OF THE INVENTION

The first object of the present invention is to provide an electrically programmable read-only memory cells in which the area occupied by a single cell can be reduced by using a single transistor provided for both writing and reading functions.

Further, the second object of the present invention is to provide redundancy signature suitable for use in an electrically programmable read-only memory of redundant structure.

The first aspect of the present invention provides an electrically programmable read-only semiconductor memory device, comprising: a memory cell including a series-connected element composed of a combination writing and reading transistor and a fuse; a high-voltage applying pad adapted to be applied with a high voltage to blow out the fuse when a data is written in the memory cell; a bit line connected to the series connected element of the memory cell and used in common for both a line for applying the high voltage applied to the high-voltage applying pad to the series-connected element and a line for reading the data written in the memory cell; and connecting/isolating means interposed between the bit line and the high-voltage applying pad, for electrically connecting both when a data is written and electrically isolating both when the data is read.

In a preferred embodiment, the connecting/isolating means are diodes. In another embodiment, the connecting/isolating means are switching elements (e.g. transistors) so controlled as to be turned on to write a data to a memory cell and off to read the data therefrom.

The second aspect of the present invention provides a semiconductor memory redundancy signature representative of whether a redundancy circuit mounted on a semiconductor memory is used or unused on the basis of whether a fuse is blown out or not, which comprises: a transistor connected in series with the fuse; a first pad connected to a gate of the transistor, for applying a voltage to control the transistor; a second pad connected in series with a series-connected element composed of the fuse and the transistor, for applying a high voltage to blow out the fuse, whereby the fuse is blown out due to snap-back action of the transistor under condition that a high voltage is applied to the second pad.

DESCRIPTION OF THE PREFERRED EMBODIMENTS

Figure 1:
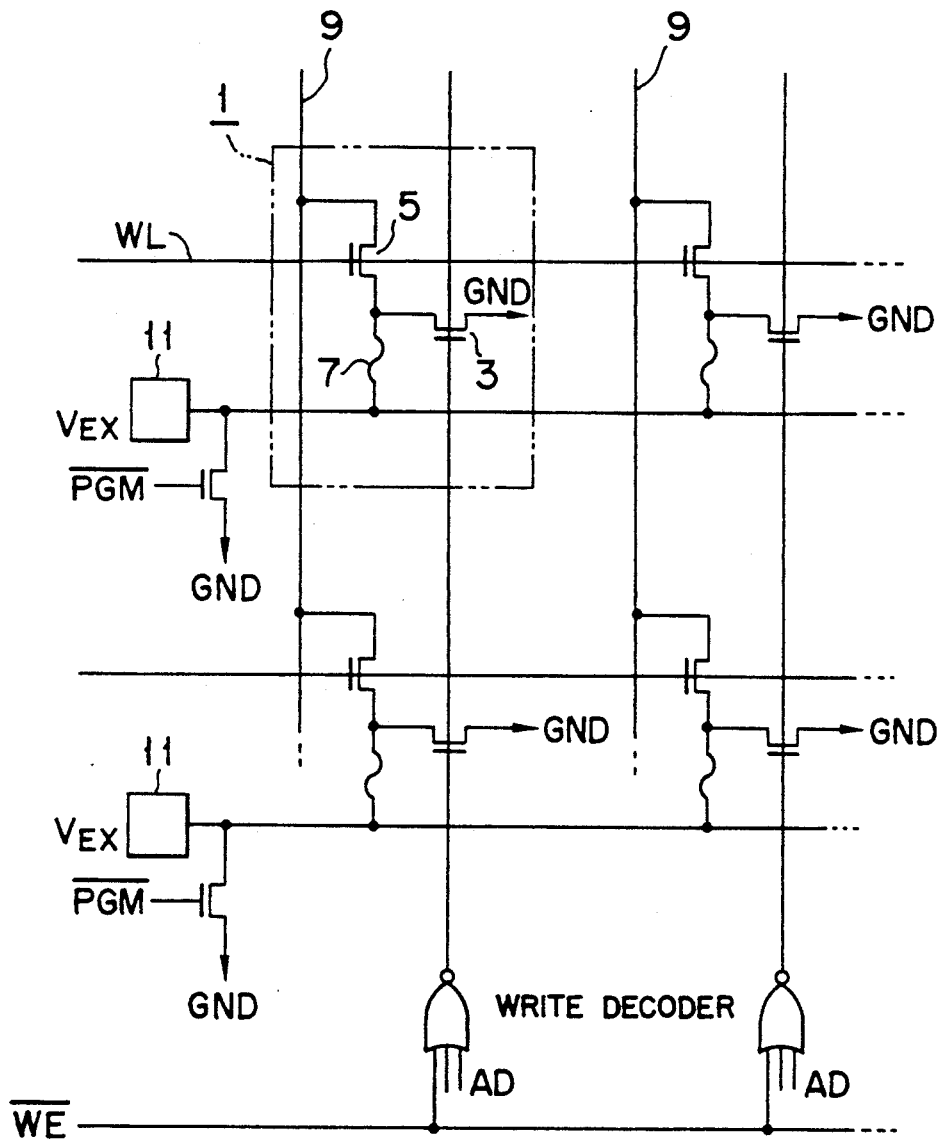
FIG. 1 is a circuit diagram showing prior-art electrically programmable read-only memory cells.
Figure 2:
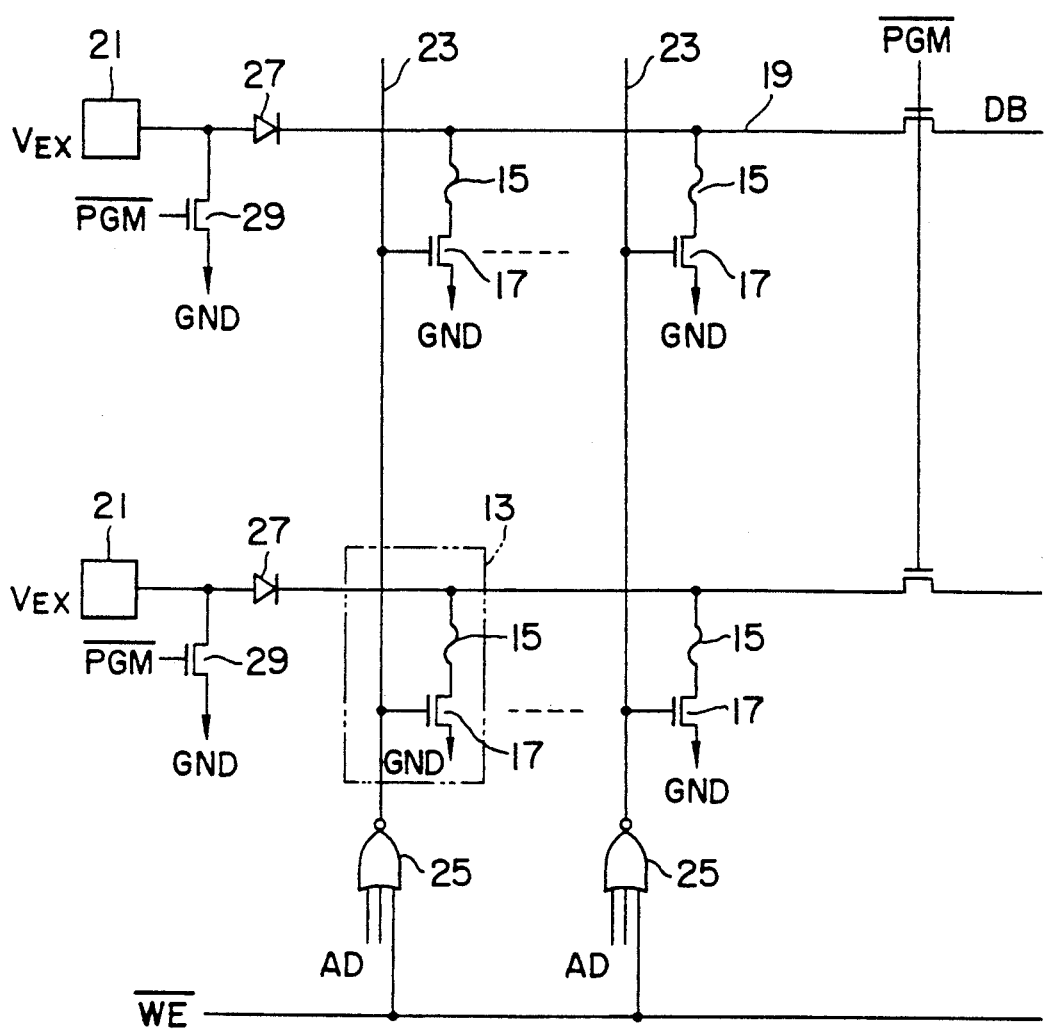
FIG. 2 is a circuit diagram showing an embodiment of the electrically programmable read-only memory cells according to the present invention.

FIG. 2 shows an embodiment of the electrically programmable ROM according to the present invention, in which each memory cell 13 is composed of a fuse 15 and a combination writing/reading transistor 17. One end of the fuse 15 is connected to a corresponding bit line 19, and the other end thereof is connected to a drain of the writing/reading transistor 17. Instead, it is also possible to connect the drain of the writing/reading transistor 17 to the bit line 19 and the source thereof to the fuse 15. To each bit line 19, a high-voltage applying pad 21 is connected via a diode 27. An anode of the diode 27 is connected to the pad 21 and a cathode thereof is connected to the bit line 19. Further, a transistor 29 is connected between the anode of the diode 27 and the ground GND to receive a program signal $\overline{PGM}$ at the gate thereof. The gate of the combination writing/reading transistor 17 is connected to a corresponding word line 23. Each word line 23 is connected to an output of a row decoder 25 to which an address signal AD and a write enable signal $\overline{WE}$ are inputted.

Figure 3:
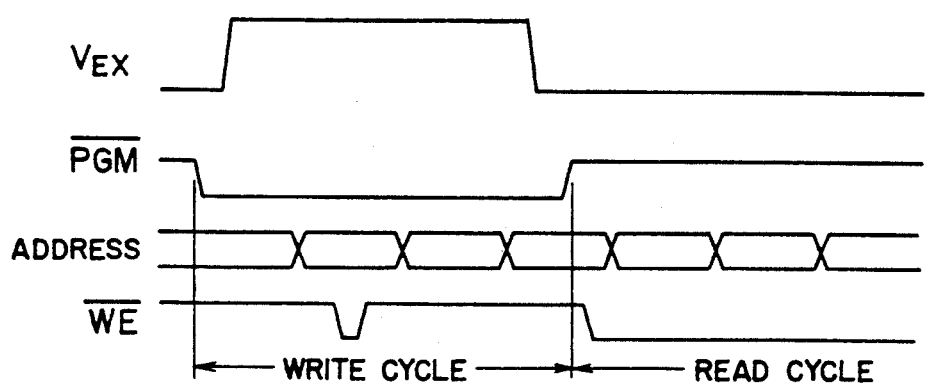
FIG. 3 is a timing chart for assistance in explaining the writing and reading operation of the cell shown in FIG. 2.

FIG. 3 shows a timing chart showing the write/read operation of this embodiment shown in FIG. 2.

In writing cycle, the program signal $\overline{PGM}$ is set to "L" level and a high voltage (about 10 V) is applied as an external voltage VEx to a high-voltage applying pad 21 connected to a selected bit line. Subsequently, addresses are scanned in sequence, and when a fuse is required to be blown out, the write enable signal $\overline{WE}$ is set to "L" level. Therefore, one memory cell can be selected and the combination writing/reading transistor 17 corresponding to the selected cell performs snap-back action (i.e. secondary breakdown), so that current flows from the high-voltage applying pad 21 to the writing/reading transistor 17, by way of the diode 27, the bit line 19 and the fuse 15, to blow the fuse 15 out.

In reading cycle, the external voltage $V_{EX}$ is set to "L" level and the program signal $\overline{PGM}$ is set to "H" level. Since the diode 27 can be biased in the reverse direction, the parasitic capacitances of the high-voltage applying pad 21 and a probe connected to the pad 21 are both isolated from the bit line 19, with the result that the capacitance of the bit line is not increased and thereby high speed operation is enabled.

Figure 4:
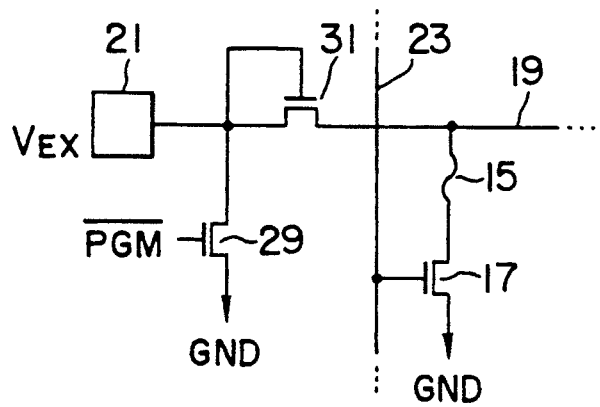
FIG. 4 is a circuit diagram showing only the essential portion of another embodiment of the electrically programmable read-only memory according to the present invention.

FIG. 4 shows only the essential portion of another embodiment, in which a transistor 31 whose gate and drain are connected to each other is used instead of the diode 27 shown in FIG. 2. When the channel width of this transistor 31 is determined sufficiently large, it is possible to obtain the transistor 31 provided with the function similar to the diode 27.

Figure 5:
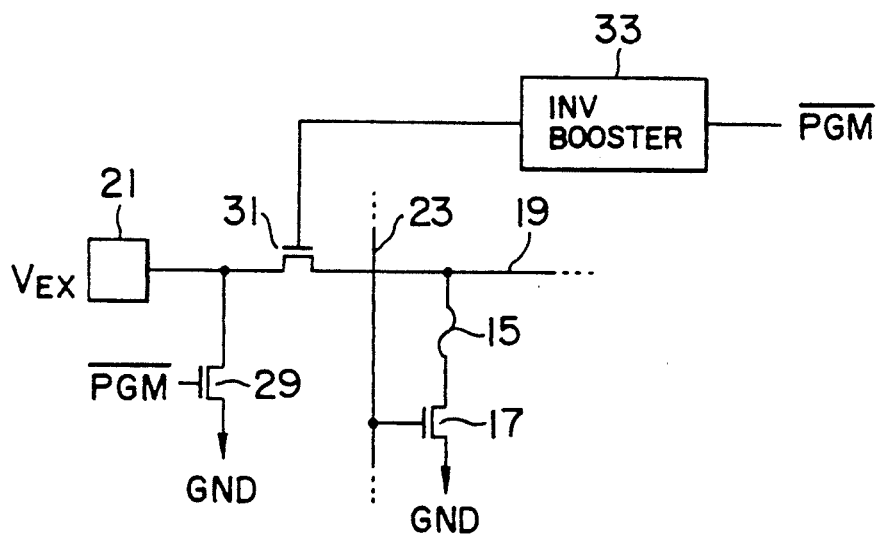
FIG. 5 is a circuit diagram showing a modification of the circuit shown in FIG. 4.

FIG. 5 shows a further another modification, in which an inversion booster 33 is connected to the gate of the transistor 31 shown in FIG. 4 and the program signal $\overline{PGM}$ is applied to an input of the inversion booster 33. In writing cycle, an "L" level program signal $\overline{PGM}$ is applied to the booster 33 to supply a sufficiently high voltage to the gate of the transistor 31, so that a sufficiently large current can be passed through the fuse 15. Further, in reading cycle, an "H" level program signal $\overline{PGM}$ is applied to the booster 33 to set the output of the booster 33 to GND level, so that the transistor 31 is turned off in the same way as in the circuit shown in FIG. 2.

As described above, in the memory cell according to the present invention, since the area occupied by each memory cell is relatively small as compared with the conventional memory cell, the memory cells are suitable for use as spare cells for the redundancy circuit of a mask ROM.

In the memory chip provided with the redundancy circuit as described above, usually a redundancy signature is provided to externally check whether the chip has been relieved by the redundancy circuit.

Figure 6:
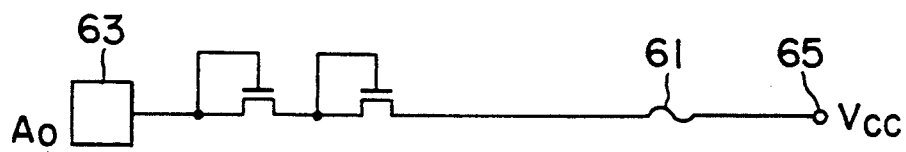
FIG. 6 is a circuit diagram showing a general redundancy signature used for a memory chip of a redundant structure.

FIG. 6 shows an example of the redundancy signature circuit as described above.

In FIG. 6, a fuse 61 on a chip using a redundancy circuit is blown out by a laser beam, while a fuse 61 on a chip using no redundancy circuit is kept as it is. Therefore, if the supply voltage Vcc is zero volt and the address input $A_0$ is at "H" level, current flows from the address input pad 63 to a power supply terminal 65 as far as the fuse 61 is connected, but no current flows as far as the fuse is blown out, thus enabling to externally check whether the redundancy circuit is used or unused.

In the afore-mentioned electrically programmable memory, however, where the redundancy signature as shown in FIG. 6 is adopted, since only the redundancy signature is dependent upon the laser beam blowing-out method and therefore not checked simultaneously at the wafer test there exists a problem in that the efficiency of wafer test is low.

To overcome this problem, the redundancy signature according to the present invention provides a method of electrically programming (i.e. blowing-out) fuses.

Figure 7:
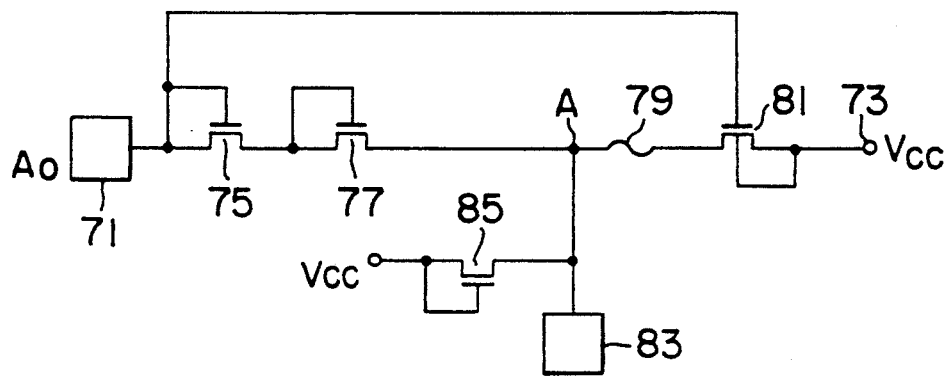
FIG. 7 is a circuit diagram showing an embodiment of the redundancy signature according to the present invention.

FIG. 7 shows an embodiment of the redundancy signature according to the present invention. Between an address input pad 71 and a power supply terminal 73 shown in FIG. 7, there are connected in series two transistors 75 and 77 whose gate and drain are connected to each other, respectively; a fuse 79; and a transistor 81 whose gate is connected to the address input pad 71. In addition, a high-voltage applying pad 83 and a source of a transistor 85 whose gate and drain are connected to each other are connected to a joint node A between the fuse 79 and the transistor 77. In the chip using the redundancy circuit, the fuse 79 is electrically blown out as follows: First, the supply potential Vcc is set to 0-V and the address input $A_0$ is set to "H" level. Thereafter, a high voltage of about 10 V is applied to the high-voltage applying pad 83 so that the transistor 81 performs snap-back action to blow out the fuse.

Under the ordinary chip operation, the high-voltage applying pad 83 is kept opened. Under these conditions, the node A is charged up to Vcc-$V_{THN}$ via the transistor 85 to prevent the node A from being floated. Further, when the fuse has been blown out, since Vcc=0 V, the transistor 85 is turned off without exerting any influence upon the fuse blow-out operation.

The use or unuse of the redundancy circuit can be discriminated by checking whether current flows from the address input pad 71 to the terminal 73 under the conditions that the supply voltage Vcc is zero volt and the address input $A_0$ is at "H" level.

As described above, it is possible to realize an electrically programmable fuse quite the same in function as the redundancy signature of the fuse of laser blowing-out type as shown in FIG. 6.

Figure 8:
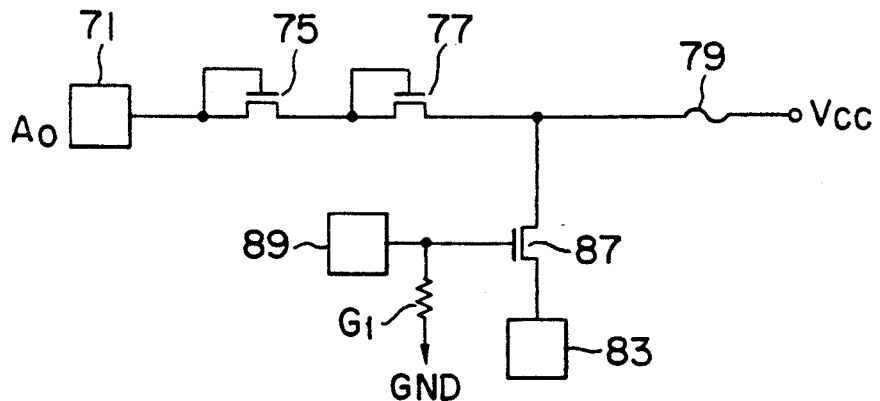
FIG. 8 is a circuit diagram showing another embodiment of the redundancy signature according to the present invention.

FIG. 8 shows another embodiment of the redundancy signature according to the present invention. In FIG. 8, the fuse 79 is blown out when current flows from the high-voltage applying pad 83 thereto via the transistor 87. That is, the selection as to whether the fuse 79 is blown out is determined based upon voltage applied to a gate voltage applying pad 89 connected to a gate of the transistor 87 and also grounded via a pull-down resister $G_1$.

The above-mentioned embodiments of the redundancy signature according to the present invention are suitable for being incorporated in mask ROMs provided with the electrically programmable memory cells as shown in FIGS. 1, 2, 4 or 5.

Without being limited to the above-mentioned embodiments, it is to be understood by those skilled in the art that various changes and modifications can be made without departing from the spirit of the invention.

What is claimed is:

1. An electrically programmable read-only semiconductor memory device, comprising:
   a memory cell including a series-connected element composed of a combination writing and reading transistor and a fuse;

a high-voltage applying pad adapted to be applied with a high voltage to blow out the fuse when a data is written in the memory cell;

a bit line connected to the series connected element of the memory cell and used in common for both a line for applying the high voltage applied to said high-voltage applying pad to the series-connected element and a line for reading the data written in the memory cell; and connecting/isolating means interposed between said bit line and said high-voltage applying pad, for electrically connecting both when the data is written and electrically isolating both when the data is read.

2. The semiconductor memory device of claim 1, wherein said connecting/isolating means includes a diode having an anode connected to said high-voltage applying pad and a cathode connected to said bit line.

3. The semiconductor memory device of claim 1, wherein said connecting/isolating means is a switching element so controlled as to be turned on when the data is written and off when read.

* * * * *